(12) United States Patent
Boy et al.

(10) Patent No.: US 11,972,986 B2
(45) Date of Patent: Apr. 30, 2024

(54) PROCESS FOR PRODUCING SEMICONDUCTOR WAFERS

(71) Applicant: SILTRONIC AG, Munich (DE)

(72) Inventors: Michael Boy, Waging am See (DE); Christina Kruegler, Dietersburg (DE)

(73) Assignee: Siltronic AG, Munich (DE)

( * ) Notice: Subject to any disclaimer, the term of this patent is extended or adjusted under 35 U.S.C. 154(b) by 839 days.

(21) Appl. No.: 16/981,048

(22) PCT Filed: Mar. 13, 2019

(86) PCT No.: PCT/EP2019/056220
§ 371 (c)(1),
(2) Date: Sep. 15, 2020

(87) PCT Pub. No.: WO2019/175207
PCT Pub. Date: Sep. 19, 2019

(65) Prior Publication Data
US 2021/0111080 A1    Apr. 15, 2021

(30) Foreign Application Priority Data
Mar. 15, 2018   (DE) ............... 10 2018 203 945.3

(51) Int. Cl.
| | |
|---|---|
| *C30B 33/08* | (2006.01) |
| *G01N 21/21* | (2006.01) |
| *G01N 21/95* | (2006.01) |
| *H01L 21/324* | (2006.01) |
| *H01L 21/66* | (2006.01) |
| *H01L 21/67* | (2006.01) |

(52) U.S. Cl.
CPC .............. *H01L 22/20* (2013.01); *C30B 33/08* (2013.01); *G01N 21/21* (2013.01); *G01N 21/9505* (2013.01); *H01L 21/324* (2013.01); *H01L 21/67288* (2013.01)

(58) Field of Classification Search
CPC . H01L 22/20; H01L 23/324; H01L 21/67282; C30B 33/08; G01N 21/22; G01N 21/9505
See application file for complete search history.

(56) References Cited

U.S. PATENT DOCUMENTS

| | | | |
|---|---|---|---|
| 5,506,154 A | 4/1996 | Kawahara et al. | |
| 6,843,201 B2 * | 1/2005 | Kuznetsov | C23C 16/4583 219/390 |
| 2005/0054124 A1 * | 3/2005 | Mun | H01L 21/324 257/E21.321 |
| 2005/0191044 A1 | 9/2005 | Aderhold et al. | |
| 2006/0035477 A1 | 2/2006 | Mai et al. | |
| 2006/0228818 A1 | 10/2006 | Chacin et al. | |
| 2008/0118641 A1 | 5/2008 | Ranish et al. | |
| 2011/0206358 A1 | 8/2011 | Goldin et al. | |
| 2012/0012983 A1 | 1/2012 | Ono et al. | |
| 2016/0032491 A1 | 2/2016 | Lu et al. | |
| 2017/0309529 A1 | 10/2017 | Aderhold et al. | |
| 2018/0247830 A1 | 8/2018 | Suzuki et al. | |

FOREIGN PATENT DOCUMENTS

| | | |
|---|---|---|
| DE | 691 25 498 T2 | 7/1997 |
| DE | 11 2016 000 465 T5 | 9/2017 |
| EP | 1 770 758 A2 | 4/2007 |
| EP | 1 995 766 A2 | 11/2008 |
| EP | 2 421 029 A2 | 2/2012 |
| JP | 2003212692 A | 7/2003 |
| JP | 2004-087591 A | 3/2004 |
| JP | 2010034288 A | 2/2010 |
| JP | 201573049 A | 4/2015 |

* cited by examiner

*Primary Examiner* — Robert M Kunemund
(74) *Attorney, Agent, or Firm* — Brooks Kushman P.C.

(57) ABSTRACT

Semiconductor wafers are produced by a process wherein a single-crystal ingot of semiconductor material is pulled and at least one wafer is removed from the ingot, wherein the wafer is subjected to a thermal treatment comprising a heat treatment step in which a radial temperature gradient acts on the wafer, wherein an analysis of the wafer of semiconductor material with respect to the formation of defects in the crystal lattice, so-called stress fields, is carried out.

17 Claims, 3 Drawing Sheets

PROCESS FOR PRODUCING SEMICONDUCTOR WAFERS

CROSS REFERENCE TO RELATED APPLICATIONS

This application is the U.S. National Phase of PCT Appn. No. PCT/EP2019/056220 filed Mar. 13, 2019, which claims priority to German Application No. 10 2018 203 945.3 filed Mar. 15, 2018, the disclosures of which are incorporated in their entirety by reference herein.

BACKGROUND OF THE INVENTION

1. Field of the Invention

The invention relates to a process for producing semiconductor wafers.

2. Description of the Related Art

Semiconductor wafers, in particular wafers of monocrystalline silicon, are the basis of modern electronics. In customer processes, the semiconductor wafers are subjected to thermal processes. This can result in thermal stresses in the crystal lattice. Stress-induced fields/stress fields may result in defective conductor structures and thus render the wafer unusable for the customer.

If the wafer has stress fields disruptive to the customer process and thus does not conform to the particular specification required is only identified following the thermal treatment of the wafer by the customer, the economic damage resulting from the already performed processing steps is great. Stress fields can have a disruptive effect on the customer process when the ratio of wafer area to the total size of all stress fields exceeds a value critical to the customer process.

There is therefore a need to deliver to customers only semiconductor wafers not liable to form such stress fields in the customer's thermal processes.

Suitable in principle is a thermal process simulation as taught for example by printed publication DE 691 25 498 T2. To this end, the thermal process steps carried out during the production of electronic components are simulated in a furnace. The semiconductor wafer is heated to a defined temperature at a defined rate over a defined duration and is subsequently cooled down to a defined temperature in a defined time. This cycle of heating and cooling may be repeated multiple times.

US 2016/0032491 A1 discloses a computer-based simulation for predicting BMD density and the size of the BMDs in a nitrogen-doped CZ silicon single crystal wafer after heat treatment steps. This computer-based simulation uses algorithms, which consider e.g. the pulling speed, the dopant concentration and the temperature gradients at the crystal surface.

However, the known processes address only formation of stress fields at the wafer edge.

It would be desirable to be able to achieve targeted early identification of possible stress fields in all regions of the semiconductor wafer.

The objects to be achieved by the invention arose from this problem.

SUMMARY OF THE INVENTION

The objects are achieved by a process for producing semiconductor wafers, wherein a single-crystal ingot of semiconductor material is pulled and at least one wafer is removed from the ingot of semiconductor material, wherein the wafer is subjected to a thermal treatment comprising a heat treatment step in which a radial temperature gradient acts on the wafer, wherein an analysis of the wafer of semiconductor material with respect to the formation of defects in the crystal lattice, so-called stress fields, is carried out.

DETAILED DESCRIPTION OF THE PREFERRED EMBODIMENTS

Figure 1:
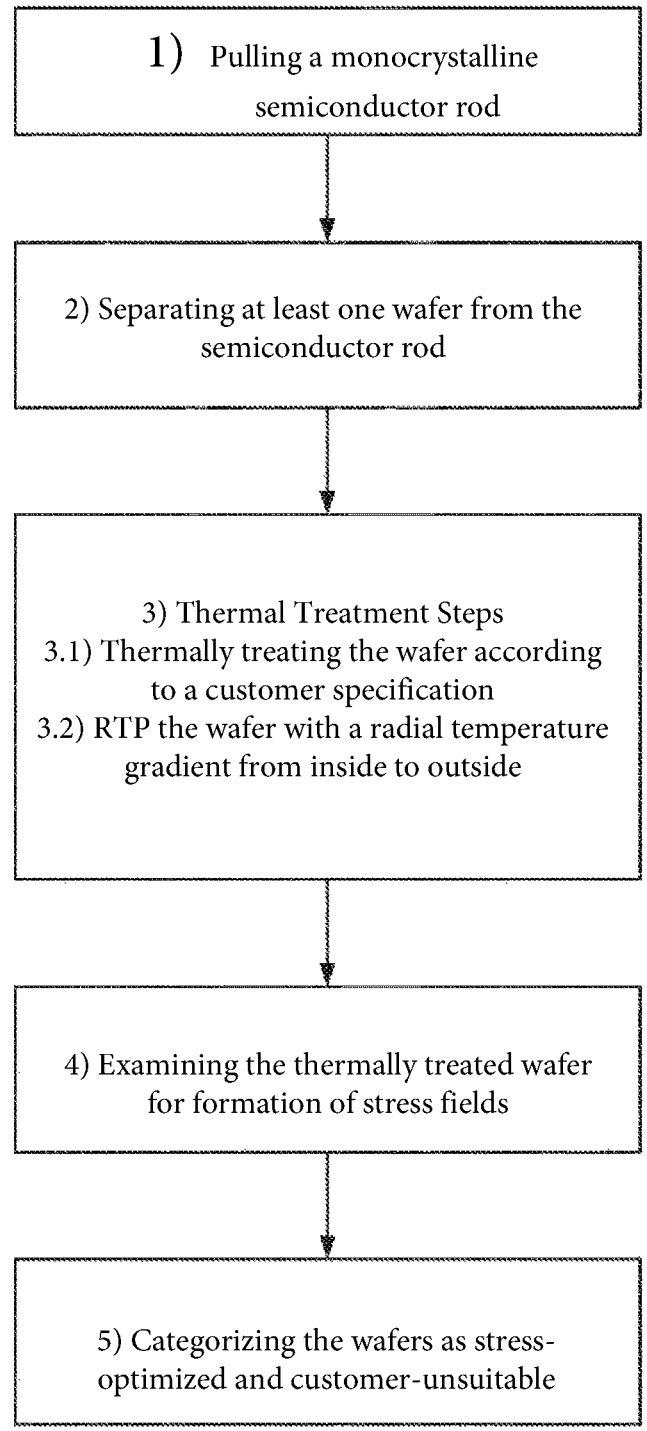
FIG. 1 summarizes the five steps of a suitable process for selecting stress-optimized/stress-free wafers of semiconductor material.

Preferred embodiments of the process according to the invention are described in detail in the description which follows. The individual features may be realized either separately or in combination as embodiments of the invention.

In one embodiment, the radial temperature gradient acts on all regions of the wafer excluding an edge region of the wafer at a distance of not more than 20 mm from the wafer edge. In another embodiment, the edge region is defined by a distance of not more than 10 mm from the wafer edge.

Determination of possible stress fields is carried out in an inner region of the wafer defined by a base area of the wafer minus an edge exclusion of 10-20 mm. To this end, the inner region of the wafer is subjected to the radial temperature gradient.

The generation of a radial temperature gradient may be effected by means of a plurality of radially arranged heat sources separately controllable in their radiation intensity.

The temperature gradient acting on the wafer may extend over n adjacent radial zones, wherein n is an integer and is greater than 1.

The temperature gradient between two adjacent zones may be from 1 to 50 Kelvin.

In a further embodiment of the thermal treatment comprises a heating step, a holding step and a cooling step, wherein the holding step corresponds to the heat treatment step for generating the radial temperature gradient acting on the wafer.

The heat treatment step for generating a radial temperature gradient is preferably carried out in a gas atmosphere comprising one or more gases selected from the group consisting of $N_2$, $O_2$, $H_2$, $NH_3$, He and Ar.

In one embodiment, the thermal treatment step in which a radial temperature gradient acts on the wafer is preceded by a thermal treatment of the wafer in which the wafer is subjected to a typical thermal budget encountered in customer processes.

The invention proceeds from a single crystal of semiconductor material pulled according to the prior art (ingot) from which individual wafers are removed for example by means of a wire saw.

The wafers of semiconductor material removed from single crystal are preferably monocrystalline silicon wafers having a diameter of 150 mm, 200 mm or 300 mm.

A semiconductor wafer comprises a front side and a backside and a circumferential edge which together from the surface of this wafer. The edge generally consists of two surfaces flattened by means of preceding grinding and etching processes, the so-called facets, and a circumferential surface perpendicular to the front/back side of the wafer, the so-called apex or blunt. The front side of the wafer of semiconductor material is by definition the side on which in subsequent customer processes the desired microstructures are applied.

Because of the pulling process, semiconductor wafers may have various defects in the crystal lattice, for example BMDs (Bulk Micro Defects) caused by oxygen precipitation or dislocation loops (dislocation clusters, interstitial agglomerates of silicon atoms, large pits).

The size of the crystal defects and the distribution thereof in a semiconductor wafer are determined inter alia by the rate of pulling of the single crystal from the melt. The crystal defects may lead, because of thermal treatment by the customer, to stress-induced fields known as "stress fields" for short.

Stress fields are local or else global stresses in the crystal lattice detectable by suitable methods such as for example SIRD (Scanning Infrared Depolarisation). SIRD utilizes the physical principle that the polarization of polarized light is altered when it passes through a region under mechanical stress.

Input of thermal energy may cause stress fields present in the crystal lattice to reach a sufficient extent to be above the limit of detection of the measurement method and thus become detectable/quantifiable with respect to the wafer area after the thermal treatment.

The present process according to the invention makes it possible, even before performing a thermal treatment of the wafer in the customer process, to identify whether the semiconductor wafers conform to the particular specification required in terms of the stress optimum, in particular in the wafer middle, i.e. within the area delimited by the edge exclusion.

The term "wafer middle" described herein below as the "inner region" preferably comprises the entire area of the front side or back side, referred to generally as a "side", of a semiconductor wafer with the exception of a defined edge exclusion. The edge exclusion is preferably at least 10 mm and at most 20 mm, measured from the circumferential edge of the semiconductor wafer.

The process according to the invention for analysis of semiconductor wafers is preferably suitable for any ingot diameter and preferably comprises the following steps in the recited sequence:

1) Pulling of a single-crystal ingot of a semiconductor material from a melt and optional cylindrical grinding of the ingot to achieve the desired diameter.
2) Removal of at least one wafer for analysis from the single-crystal ingot of semiconductor material by means of for example a wire saw at at least one representative point on the ingot and one or more process steps preparing the surface of this wafer.
3) Performing a first thermal treatment step corresponding to the customer specification and performing a second thermal treatment step with the at least one wafer of semiconductor material, wherein in the second thermal treatment step a radial temperature gradient acts on at least one side of the semiconductor wafer from the inside outward or from the outside inward.
4) Analysis of the wafer of semiconductor material treated in step 3) with respect to the possible formation/extent of stress fields, in particular in the inner region of the wafer, by means of suitable measurement methods.
5) Distinguishing this wafer and the wafers separated from the ingot segment represented by this wafer into stress-optimized wafers conforming to the customer specification and rejected wafers not conforming to the customer specification.

The terms "stress optimum" and "stress-optimized" relate to the quantitatively evaluable extent of stress fields in a defined radial region on the surface of the wafer of semiconductor material. Both terms also comprise the stress field-free state, i.e. when after performing the thermal stress-causing step 3) of the process according to the invention no stress fields are detectable on the surface of the wafer in the subsequent step 4) having regard to the particular limit of detection of the measurement method employed.

The at least one wafer removed from a ingot in step 2) is the wafer of semiconductor material to be analysed with respect to possible stress fields in the inner region. It is preferable when this wafer represents further wafers originating from the particular ingot segment from which the semiconductor wafers are subsequently to be cut for further processing.

It is preferable when the at least one wafer of semiconductor material to be analysed represents a ingot segment preferably having a length of preferably at least 20 cm, more preferably of at least 40 cm, wherein all product wafers removed from this ingot segment have the same crystal structure as the at least one wafer of semiconductor material to be analysed.

The number and or the position with respect to the longitudinal axis of the ingot of the test wafers removed from a ingot preferably depends on the length and the expected/known uniformity of the crystal defects along the longitudinal axis of the ingot/of the ingot segment.

The ingot segment may, but need not, have been rounded, i.e. ground to the target diameter, before the removal of the at least one wafer of semiconductor material to be analysed.

It is preferable when after the removal of the at least one wafer of semiconductor material to be analysed from the ingot segment the edge thereof is rounded and ground to the desired target diameter.

If for example at least one wafer of semiconductor material is removed from a single crystal ingot segment having a diameter of 312 mm, this wafer after edge rounding has the desired target diameter of 300 mm and thus has the same diameter as the later production wafers, i.e. the wafers for the customer.

The inventor has identified that, for the semiconductor wafers removed from a single-crystal ingot, at least one wafer subjected to the process described herein below can provide a representative indication with respect to the stress fields for the semiconductor wafers subsequently removed from this ingot segment. This makes it possible to determine rapidly and at low cost whether the semiconductor wafers obtained from the ingot and treated in the thermal treatment step 3) conform to the particular specification required in respect of freedom from stress in particular in the inner region of the semiconductor wafer.

The heat treatment carried out in step 3) of the process according to the invention is preferably carried out in two steps 3A and 3B.

In the first step 3A the heat treatments/thermal budget later performed by the customer in the context of a device production are employed/thermally for the at least one wafer of semiconductor material conforming to the customer specification that is to be analysed.

The second step 3B comprises carrying out a further thermal treatment step preferably in the form of a three-step rapid thermal processing (RTP) which is directed specifically at radial regions in the direction of the wafer centre.

Possible stress fields brought about by the two thermal treatment steps are determined by means of an appropriate measurement. Suitable measurement methods for the detection and quantitative evaluation of the area of stress fields are for example a combination of SIRD (Scanning Infrared Depolarization) and XRT (X-ray Topography). Stress fields are local or else global stresses in the crystal lattice detectable by suitable methods such as for example SIRD (Scanning Infrared Depolarisation). SIRD utilizes the physical principle that the polarization of polarized light is altered when it passes through a region under mechanical stress. Further, likewise suitable processes for detecting stress fields include inter alia micro-Raman, photoluminescence, and visual inspection of the wafer surface after defect etching or metal decoration.

The thermal customer process simulation in step 3A preferably comprises/corresponds to the thermal budget to which the wafer is subjected during the making of the semiconductor devices at the customer. To this end the at least one wafer of semiconductor material to be analysed is subjected to the thermal conditions of the customer process in a suitable heat treatment furnace, for example a vertical furnace from ASM International NV, Almere, Netherlands.

The heat treatment furnace must accordingly allow the temperature profiles necessary for the customer process and the establishment of the particular gas atmosphere. Such a customer process may be for example the so-called Toshiba test (3 h at 780° C., then 16 h at 1000° C.).

The second heat treatment/the high-temperature processing of the wafer is carried out in step 3B in a process chamber, wherein the necessary heat is generated by preferably radially arranged heat sources, for example halogen lamps.

This comprises transferring preferably a large amount of heat to at least one side of the semiconductor wafer preferably in a short time. This so-called rapid thermal processing (RTP) is described in general terms in US 2005/0191044 A1 for example. A corresponding apparatus is disclosed in US 2011/0206358 A1 for example.

One example of an RTP is rapid thermal annealing (RTA). RTA processes are disclosed in EP 2 421 029 A1 and in DE 11 2016 000 465 T5 for example. This comprises a heating of the wafer to temperatures of 1000° C. and higher within just a few seconds.

RTP comprises three stages, a heating phase (ramp-up) in which the semiconductor wafer is heated to the target temperature within a defined time, the holding phase (soak step) in which the target temperature is kept constant for a defined time and a cooling phase (ramp down) in which the semiconductor wafer is cooled within a defined time.

RTP results in a stress loading within the crystal structure of the wafer and therefore new stress fields may be formed or existing stress fields may increase in extent within the crystal structure (detuning/mismatch of the crystal lattice, stress loading).

According to the prior art this stress loading occurs primarily in the edge region of the wafer because of the architecture. However, RTP can also result in stress occurring in the centre of the wafer and leading to stress fields there.

Step 3B comprises carrying out specific radial heat treatment preferably in the inner region of the at least one side of the wafer of semiconductor material to be analysed. Radial heat treatment entails a preferably punctiform heat source preferably along a line which preferably defines the diameter or preferably the radius of the wafer or radial heat treatment is effected in a circle along a line which preferably defines the diameter or the radius of the wafer, wherein circular heat treatment is effected by means of a circular heat source or the wafer is rotated in a circle under a punctiform heat source or the heat source is rotated in a circle, wherein the circle preferably widens from the inside outward or is reduced in size from the outside inward along the diameter or radius of the semiconductor wafer. To this end it is preferable when at least one side of this wafer is subjected to a thermal gradient defined on the basis of the wafer diameter, i.e. the heat input at the wafer edge is different to the heat input in the wafer middle, in a three-stage RTP step in a suitable heat treatment furnace, for example from AMAT Vantage Radiance+from Applied Materials, Santa Clara, California, USA.

The apparatus for targeted/specific radial heat treatment of the inner region of the wafer of semiconductor material to be analysed which is used in step 3B preferably has radially arranged heat sources, for example heating lamps, which are separately controllable. If for example this apparatus has four separately controllable radially arranged heat sources the at least one side of the wafer of semiconductor material to be analysed may be irradiated with varying intensity between the centre of the wafer and the edge region of the wafer such that between the centre and the edge of the wafer a temperature gradient consisting of four zones may be accomplished.

In step 3B the preferably radial thermal irradiation is preferably effected preferably during a three-stage RTP at least on one side of the wafer of semiconductor material, preferably on the front side. The preferably radial thermal irradiation may preferably also be effected on both sides in step 3B, i.e. preferably radially arranged separately controllable heat sources irradiate both the front side and the backside of the wafer of semiconductor material with a temperature gradient preferably running from the inside outward.

Herein below, zone 1 is the innermost radial zone having heat sources, i.e. the zone which irradiates the middle of the wafer to be analysed. When n is the number of the individually controllable radially arranged heat sources zone n describe the outer radially arranged heat sources irradiating the wafer edge, wherein n is an integer and greater than 1. In the above examples zone 4 thus describes the outer arrangement of separately controllable heat sources, which irradiates the edge of the wafer of semiconductor material to be analysed.

The area of zone 1 of the at least one side of the wafer of semiconductor material, i.e. the wafer middle, is defined by the area irradiated by the innermost preferably radially arranged and preferably separately controllable heat sources. Zone 2 on the at least one side of the wafer of semiconductor material, which is directly adjacent to zone 1, is accordingly the radial region whose area corresponds to the areas irradiated by the radially arranged and separately controllable heat sources of zone 2. Thus, the inner boundary of zone 2 corresponds to the outer boundary of zone 1. The radial area of zone n on the at least one side of the wafer of semiconductor material is the radial area at the wafer edge irradiated by the outer separately controllable heat sources. The outer edge of the radial zone n is preferably determined by the defined edge exclusion. The zones preferably have the same radial distance from one another so that for a wafer, having a diameter of 300 mm the radius is 150 mm and in the case of 5 zones the radius of each of the 5 zones is 30 mm respectively.

It is preferable when the preferably separately controllable heat difference between two preferably radially arranged adjacent heat sources, i.e. for example between radial zone 1 and radial zone 2 adjacent to radial zone 1, is in the range from preferably 1 to 50 Kelvin (K). It is likewise preferable when the separately controllable heat difference between two radially arranged adjacent heat sources is in the range from preferably 3 to 30 Kelvin and more preferably in the range from 5 to 15 Kelvin.

For the second thermal treatment of the at least one wafer of semiconductor material to be analysed this wafer is preferably placed in the heat treatment furnace, referred to herein below as an RTP apparatus. The gas atmosphere preferably present during the thermal processing in the RTP apparatus may consist of for example one of the gases oxygen ($O_2$), nitrogen ($N_2$), hydrogen ($H_2$), ammonia ($NH_3$), helium (He) or argon (Ar) or a mixture of these gases suitable from a chemical or process engineering standpoint and may accordingly be oxidizing or reducing or inert.

In the RTP apparatus the at least one wafer of semiconductor material to be analysed is in the first stage initially heated to a temperature of preferably 600° C. to 1350° C. in a gas atmosphere over a defined time, for example 20 seconds (heating phase, ramp-up). It is preferable when the ramp-up step in step 3B is already effected with the radial temperature gradient (detuning) also used in the holding step (so-called soak step). It is likewise preferable when no radial temperature gradient acts on the at least one side of the wafer of semiconductor material in this first step of the RTP process.

The holding phase, which comprises a defined duration, for example 3 minutes, comprises carrying out the heat input onto the wafer of semiconductor material with a radial temperature gradient along the zones 1 to n, wherein n is greater than 1 and an integer. If the RTP apparatus comprises for example four zones the wafer centre is irradiated with a temperature that is for example 40 Kelvin higher than the edge region of the wafer of semiconductor material located in the irradiation region of zone 4.

After termination of the holding phase, the wafer located in the RTP apparatus is preferably controlled cooled down over a defined duration (ramp-down). The duration of the cooling phase may be shorter, identical or longer than the duration of the heating phase. The duration of the cooling phase may be 18 seconds for example. It is preferable when the ramp-down step in step 3B is carried out with the radial temperature gradient from the holding step. It is likewise preferable when the ramp-down step in step 3B is carried out without a temperature gradient.

It is preferable when during the RTP a preferably radial temperature gradient acts on the at least one side of the semiconductor wafer in one of the three stages/phases. It is preferable when during the RTP a preferably radial temperature gradient acts on the at least one side of the semiconductor wafer in all three stages (heating phase, holding face and cooling phase), preferably only in the first two stages, preferably only in the holding phase or preferably in the holding phase and the cooling phase.

Decisive in this step 3B of the process is the establishment of a preferably radial temperature gradient in the direction of the wafer middle. The temperature difference between the innermost zone 1 and the directly adjacent radially arranged zone 2 is preferably in the range from 3K to 30K, so that the corresponding heat sources thermally irradiate zones 1 and 2 with a corresponding temperature difference.

It is preferable when the temperature difference between the individual zones 1 and n is identical. It is likewise preferable when the temperature difference between zones 1 and n increases linearly or exponentially, wherein the temperature in zone 1 is higher than zone n or wherein the temperature in zone 1 is lower than in zone n and n is an integer greater than 1.

The features specified in respect of the embodiments of the process according to the invention recited hereinabove are elucidated in the description of the figures and in the claims. The individual features may describe advantageous implementations eligible for protection in their own right.

FIG. 1 summarizes the five steps of a suitable process for selecting stress-optimized/stress-free wafers of semiconductor material.

Figure 2:
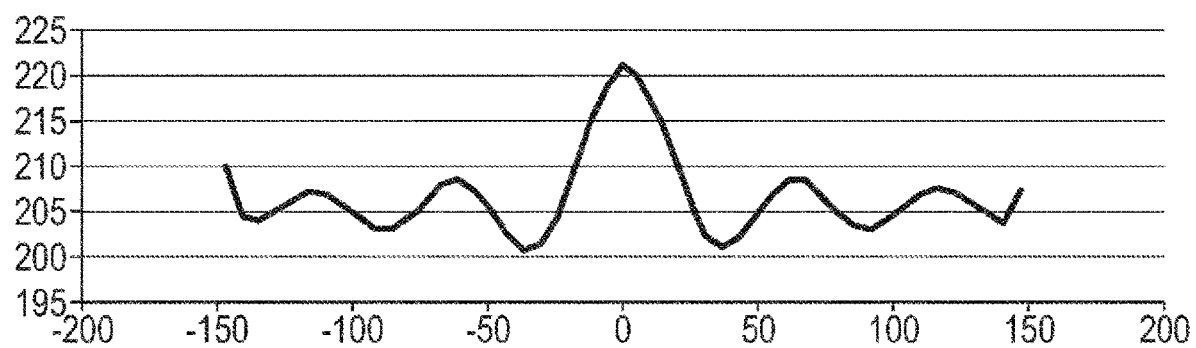
FIG. 2 shows by way of example a radial oxide thickness profile on the surface of a wafer of semiconductor material having a diameter of 300 mm after the second thermal treatment with a radial temperature gradient of 10 K between the wafer edge and the wafer middle.

FIG. 2 shows by way of example a radial oxide thickness profile on the surface of a wafer of semiconductor material having a diameter of 300 mm after the second thermal treatment with a radial temperature gradient of 10 K between the wafer edge and the wafer middle. The higher temperature in the wafer middle has resulted in a thicker oxide layer compared to the wafer edge. Plotted along the x-axis is the radial position of the wafer of semiconductor material in mm and plotted along the y-axis is the relative oxide layer thickness profile in angstroms.

Figure 3A:
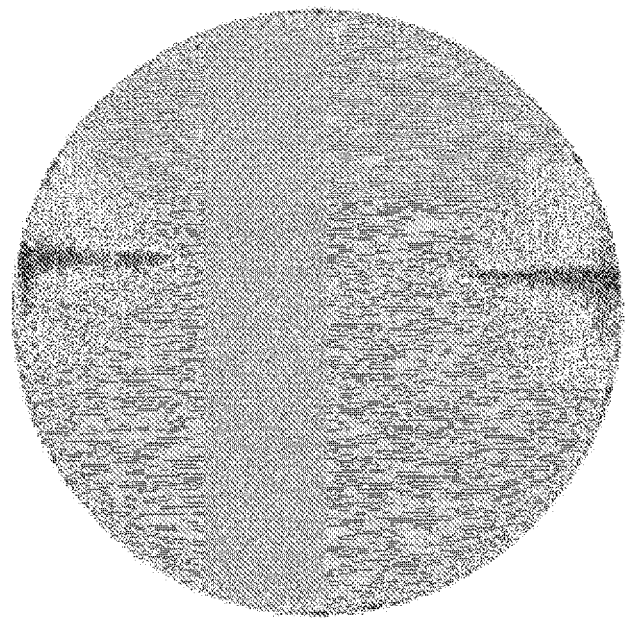
FIGS. 3A and 3B shows the result of two SIRD measurements after performing the process according to the invention.
Figure 3B:
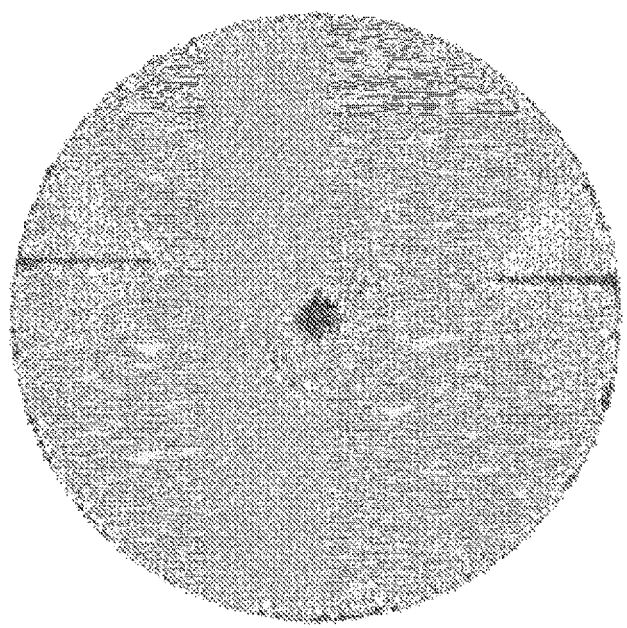

FIG. 3 shows the result of two SIRD measurements after performing the process according to the invention. The horizontal dark areas on the right- and left-hand sides are slip lines, which occur as a result of mounting the semiconductor wafer onto a carrier during performance of the first thermal treatment step according to the customer specification. FIG. 3*a* shows a stress-optimized wafer of semiconductor material exhibiting no stress fields in the region of the wafer centre while FIG. 3*b* shows an off-specification wafer of semiconductor material having stress fields in the region of the wafer middle, i.e. within the area delimited by the edge exclusion.

The temperature gradient acting on the inner region of the wafer as a result of the preferably radial temperature profile may be checked/imaged on the surface of the wafer of semiconductor material to be analysed via a radial oxide thickness profile, i.e. the thickness of the oxide layer formed in the case of a suitable gas atmosphere, for example an oxygen/nitrogen mixture (FIG. 2).

FIG. 2 shows by way of example a radial oxide thickness profile measured with an ellipsometer for a wafer of semiconductor material having a diameter of 300 mm after the second heat treatment step 3B. The thickness of the oxide layer formed depends on the amount of heat radiated. In this example, a temperature change of one kelvin corresponds to a change in the thickness of the oxide layer of about 1.5 angstroms. Accordingly, the wafer middle was irradiated with a temperature 6 kelvin higher than the immediately adjacent radial region.

The temperature gradient-mediated higher temperature action caused thereby in the inner region of the wafer to be analysed enables formation and thus identification of stress fields in this region and resulting stress fields may therefore be detected using suitable measurement methods in step 4) of the process according to the invention.

In order to be able to exclude stress fields in the edge region of the wafer arising as a consequence of mounting the radial temperature profile in step 3B is chosen such that the temperature gradient directed toward the inner region, i.e. toward the wafer middle, acts on the wafer surface with an edge exclusion of preferably at least 10 mm, preferably 20 mm measured from the wafer edge.

Step 4) of the process comprises performing the analysis of the at least one wafer in respect of the formation of stress fields/the presence of detectable stress fields in particular in the inner region of the wafer (FIG. 3) according to the prior art, for example by SIRD or XRT.

Step 5) of the process comprises selection of the wafers by distinguishing stress-optimized wafers and wafers unsuitable for the customer. If the at least one wafer of semiconductor material for analysis which also represents a corresponding ingot segment has few, if any, stress fields in the inner region after the two-stage thermal treatment in step 3) a stress-optimized wafer which conforms to the customer requirements is concerned.

In the context of the present invention, a wafer of semiconductor material has few stress fields when the area/number of these stress fields relative to the total area of the front side of the wafer after the step 3) has a value, which is non-critical for the particular customer process, i.e. the wafers, conform to the particular customer specification.

The remaining wafers from the ingot represented by this at least one wafer of semiconductor material to be analysed likewise conform to this specification and are thus also stress-optimized in the wafer centre area.

If the at least one wafer of semiconductor material to be analysed has too many stress fields in the inner region of the wafer relative to the customer requirement (FIG. 3) said wafers and the wafers that may be singulated from the corresponding ingot segment do not conform to the customer specification and the particular ingot is discarded for this customer requirement/specification. This avoids time- and cost-intensive singulation and subsequent processing of semiconductor wafers not conforming to the customer specification.

The above description of illustrative embodiments is to be understood as being exemplary. The disclosure made thereby enables a person skilled in the art to understand the present invention and the advantages associated therewith and comprehends alterations and modifications to the described structures and processes that are obvious within the understanding of a person skilled in the art. All such alterations, modifications, and equivalents shall therefore be covered by the scope of protection of the claims.

The invention claimed is:

1. A process for producing semiconductor wafers comprising the following steps in the given sequence:
   a) pulling a single-crystal rod of a semiconductor material from a melt and optionally cylindrically grinding the rod,
   b) separating a plurality of semiconductor wafers from the rod;
   c) removing at least one wafer for analysis from the single-crystal rod,
   d) performing a first thermal treatment step corresponding to a thermal budget to which the wafer is subjected during fabrication of semiconductor devices on the wafer, and performing a second thermal treatment step with the at least one wafer of semiconductor material, wherein in the second thermal treatment step a radial temperature gradient acts on at least one side of the semiconductor wafer from the inside outward or from the outside inward,
   e) analyzing the wafer of semiconductor material treated in step d) with respect to the possible formation and/or the extent of stress fields,
   f) distinguishing this wafer and further wafers of the plurality of semiconductor wafers separated from a rod section represented by this wafer into stress-optimized wafers conforming to the thermal budget to which the wafers are subjected during the fabrication of semiconductor devices on the wafer from rejected wafers not conforming to this thermal budget.

2. The process for producing semiconductor wafers of claim 1, wherein the radial temperature gradient acts on all regions of the wafer excluding an edge region of the wafer with an edge exclusion of 20 mm.

3. The process of claim 1, wherein the radial temperature gradient acts on all regions of the wafer excluding an edge region of the wafer with an edge exclusion of 10 mm.

4. The process of claim 1, wherein the heat treatment step for generating a radial temperature gradient is effected by means of a plurality of radially arranged heat sources separately controllable in their radiation intensity.

5. The process for producing semiconductor wafers of claim 1, wherein the temperature gradient acting on the wafer extends over n adjacent radial zones, wherein n is an integer and is greater than 1.

6. The process for producing semiconductor wafers of claim 5, wherein the temperature gradient between two adjacent zones is 1 to 50 kelvin.

7. The process for producing semiconductor wafers of claim 1, wherein the thermal treatment comprises a heating phase, a holding phase and a cooling phase, wherein the holding phase corresponds to the heat treatment step for generating the radial temperature gradient acting on the wafer.

8. The process for producing semiconductor wafers of claim 1, wherein the thermal treatment step for generating a radial temperature gradient is carried out in a gas atmosphere comprising one or more gases selected from the group consisting of $O_2$, $H_2$, $NH_3$, He and Ar.

9. The process of claim 1, wherein based on the determination of the stress fields in the at least one wafer, the single-crystal rod from which this at least one wafer was removed is assigned a particular specification with respect to stress fields.

10. The process of claim 1, wherein a single wafer of the plurality of wafers is analyzed.

11. The process for producing semiconductor wafers of claim 5, wherein the temperature gradient between two adjacent zones is 5 to 30 kelvin.

12. A process for producing a plurality of stress free or stress optimized semiconductor wafers having a front side, a rear side, and a circumferential edge, comprising the following steps:
   a) receiving a thermal budget for fabricating semiconductor devices on a semiconductor wafer;
   b) pulling a single-crystal rod of the semiconductor and optionally cylindrically grinding the rod;
   c) separating a plurality of semiconductor wafers from the single-crystal rod;
   d) identifying a test semiconductor wafer having properties representative of the plurality of semiconductor wafers;

e) performing a first thermal treatment step corresponding to the thermal budget referred to in step a) on the test semiconductor wafer;

f) performing a second thermal treatment on the test semiconductor wafer following step e) to establish a radial temperature gradient in at least one interior zone of the semiconductor wafer, the at least one interior zone positioned at least 10 mm inward from the circumferential edge of the test semiconductor wafer;

g) analyzing the test wafer for stress fields to determine whether the test semiconductor wafer has no stress or a level of stress suitable for fabricating semiconductor devices according to the thermal budget; and h) classifying the remaining plurality of semiconductor wafers as stress optimized wafers or rejected wafers in accordance with the result of step g).

13. The process of claim 12, wherein the second thermal treatment establishes n adjacent radial zones, wherein n is an integer greater than 1.

14. The process of claim 12, wherein the plurality of wafers are wafers sawn from an ingot segment having a length of at least 20 cm and having the same crystal structure along its length.

15. The process of claim 12, wherein the thermal budget corresponds to a treatment of 3 hours at 780° C. followed by 16 hours at 1000° C.

16. The process of claim 12, wherein the plurality of stress free or stress optimized semiconductor wafers are stress free semiconductor wafers.

17. The process of claim 1, wherein during the first thermal treatment step, the wafer has no radial temperature gradient.

* * * * *